United States Patent
Gupta (10) Patent No.: US 12,166,489 B2
(45) Date of Patent: Dec. 10, 2024

(54) DISCRETE TIME ANALOG CIRCUIT

(71) Applicant: Navitas Semiconductor Limited, Dublin (IE)

(72) Inventor: Milind Gupta, Irvine, CA (US)

(73) Assignee: Navitas Semiconductor Limited, Dublin (IE)

( * ) Notice: Subject to any disclaimer, the term of this patent is extended or adjusted under 35 U.S.C. 154(b) by 0 days.

(21) Appl. No.: 18/083,876

(22) Filed: Dec. 19, 2022

(65) Prior Publication Data

US 2024/0204761 A1 Jun. 20, 2024

(51) Int. Cl.
*H03K 5/00* (2006.01)
*H03K 5/003* (2006.01)
*H03K 19/20* (2006.01)

(52) U.S. Cl.
CPC ............. *H03K 5/003* (2013.01); *H03K 19/20* (2013.01)

(58) Field of Classification Search
CPC .......... H03K 5/003; H03K 19/20; G06G 7/16; G06G 7/163; G06G 7/18; G06G 7/184; G06G 7/186
See application file for complete search history.

(56) References Cited

U.S. PATENT DOCUMENTS

| | | | | |
|---|---|---|---|---|
| 6,812,769 B1 * | 11/2004 | Yang | ......................... | G06G 7/16 |
| | | | | 327/356 |
| 7,511,645 B1 * | 3/2009 | Ranucci | .............. | H03M 1/1019 |
| | | | | 341/120 |
| 9,069,995 B1 * | 6/2015 | Cronie | ..................... | G06G 7/16 |
| 2009/0001946 A1 * | 1/2009 | Mehas | ..................... | H02M 1/36 |
| | | | | 323/266 |
| 2012/0037408 A1 * | 2/2012 | Chang | ..................... | G01R 1/02 |
| | | | | 977/932 |
| 2019/0072590 A1 * | 3/2019 | Kim | ..................... | G01R 19/257 |
| 2019/0190504 A1 * | 6/2019 | Kim | ..................... | G06G 7/16 |
| 2019/0253039 A1 * | 8/2019 | Sicurella | .................. | H03K 5/24 |
| 2023/0050386 A1 * | 2/2023 | Guo | ......................... | G06G 7/16 |

* cited by examiner

Primary Examiner — Tuan T Lam
(74) Attorney, Agent, or Firm — Fisher Broyles, LLP (57) ABSTRACT

Aspects of this disclosure relate to a discrete time analog multiplier and a discrete time analog divider. The multiplier and divider circuits are mainly using linear components such as capacitors, current sources, comparators and transconductance amplifiers, etc. The dynamic range is only limited by the available range of supply to the circuit rather than dependent on the transistor's linearity. Such limitation could be overcome by proper scaling or autoscaling of the signals. Hence, the limited dynamic range can be easily improved. With the help of using basic electronic components and operating in the analog domain, the conversion from analog to digital and/or digital to analog is not required.

15 Claims, 7 Drawing Sheets

DISCRETE TIME ANALOG CIRCUIT

FIELD OF THE INVENTION

The present disclosure relates to a discrete time analog circuit and more particularly to a discrete time analog multiplier and a discrete time analog divider.

BACKGROUND OF THE INVENTION

Analog multiplier and divider circuits are made to multiply and divide analog signals of either voltage or current, which have a variety of applications like voltage squaring, voltage divider, square rooter, etc.

For the conventional analog multiplier, it uses the transfer characteristics of a transistor to achieve the multiplication. For example, the exponential relation between the base emitter voltage and the collector current is used to create translinear loops and multiply signals. Other conventional devices may employ the transfer characteristics of MOS transistors either in subthreshold or saturation region. The above-mentioned devices would be inaccurate if the transistor does not work in the specific region of operation. Hence, the ranges of input and output are quite limited, and careful control is required.

SUMMARY OF THE INVENTION

A discrete time analog circuit according to an embodiment of the present invention comprises a voltage to time converting means, a control logic means, and a multiplier means. The voltage to time converting means comprises: a current source configured to receive a supply voltage and generate a reference current; a first capacitor coupled with the current source; a reset switch coupled with a node provided between the current source and the first capacitor, which is driven by a reset signal; and a comparator with an inverting input connecting to the node between the current source and the first capacitor, a non-inverting input for receiving a first voltage and an output. The control logic means comprises: a first logic gate having a gate output and first and second gate inputs, the first gate input adapted to receive a first phase signal, the second gate input adapted to be coupled to the output of the comparator, the gate output outputting a first control signal; a second logic gate having a gate output and first and second gate inputs, the first gate input adapted to receive the first phase signal, the second gate input adapted to receive the reset signal, the gate output outputting a second control signal; a third logic gate having a gate output and first and second gate inputs, the first gate input adapted to connect to a node between the second gate input of the first logic gate and the output of the comparator, the second gate input adapted to receive a second phase signal, the gate output outputting a third control signal; and a fourth logic gate having a gate output and first and second gate inputs, the first gate input adapted to receive the second phase signal, the second gate input adapted to receive the reset signal, the gate output outputting a fourth control signal. The multiplier means couples with the voltage to time converting means, which comprises: a switch unit including a first switch, a second switch, a third switch and a fourth switch controlled by the first control signal, the second control signal, the third control signal, and the fourth control signal respectively, a node being provided between the first switch and the third switch, which is configured to receive a first current; a second capacitor coupled to a node between the first switch and the second switch; a third capacitor coupled to a node between the third switch and the fourth switch; and an output terminal selectively coupled to the node between the first switch and the second switch and the node between the third switch and the fourth switch.

A discrete time analog circuit according to another embodiment of the present invention comprises a voltage to time converting means, a control logic means, and a multiplier means. The voltage to time converting means comprises a first capacitor; a reset switch coupled with the first capacitor, which is driven by a reset signal; and a comparator with an inverting input connecting to a node between the reset switch and the first capacitor, a non-inverting input for receiving a first voltage and an output, wherein the node between the reset switch and the first capacitor is configured to receive a first current. The control logic means comprises a first logic gate having a gate output and first and second gate inputs, the first gate input adapted to receive a first phase signal, the second gate input adapted to be coupled to the output of the comparator, the gate output outputting a first control signal; a second logic gate having a gate output and first and second gate inputs, the first gate input adapted to receive the first phase signal, the second gate input adapted to receive the reset signal, the gate output outputting a second control signal; a third logic gate having a gate output and first and second gate inputs, the first gate input adapted to connect to a node between the second gate input of the first logic gate and the output of the comparator, the second gate input adapted to receive a second phase signal, the gate output outputting a third control signal; and a fourth logic gate having a gate output and first and second gate inputs, the first gate input adapted to receive the second phase signal, the second gate input adapted to receive the reset signal, the gate output outputting a fourth control signal. The multiplier means couples with the voltage to time converting means, which comprises: a current source configured to receive a supply voltage and generate a reference current; a switch unit including a first switch, a second switch, a third switch and a fourth switch controlled by the first control signal, the second control signal, the third control signal, and the fourth control signal respectively, a node being provided between the first switch and the third switch, which is configured to receive the reference current; a second capacitor coupled to a node between the first switch and the second switch; a third capacitor coupled to a node between the third switch and the fourth switch; and an output terminal selectively coupled to the node between the first switch and the second switch and the node between the third switch and the fourth switch.

DETAILED DESCRIPTION OF THE PREFERRED EMBODIMENTS

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

This description and the figures constitute a disclosure of example embodiments and applications that illustrate various features and advantages of the discrete time analog circuits. In some embodiments, the discrete time analog circuits are analog multiplication circuits; while in some embodiments, the discrete time analog circuits are analog division circuits. The circuits in the various analog multiplication and division embodiments herein are mainly using linear components such as capacitors, current sources, comparators and transconductance amplifiers, etc. Without using the bipolar transistors as presented in the conventional multiplication or division circuits. The dynamic range is only limited by the available range of supply to the circuit rather than dependent on the transistor's linearity. Such limitation could be overcome by proper scaling or autoscaling of the signals. Hence, the limited dynamic range can be easily improved. Moreover, with the help of using basic electronic components and operating in the analog domain, the conversion from analog to digital and/or digital to analog is not required.

In the following examples 1 through 3, variations of a device directed to a discrete time analog multiplier are described. While in the following examples 4 through 6, variations of a device directed to a discrete time analog divider are described.

Figure 1:
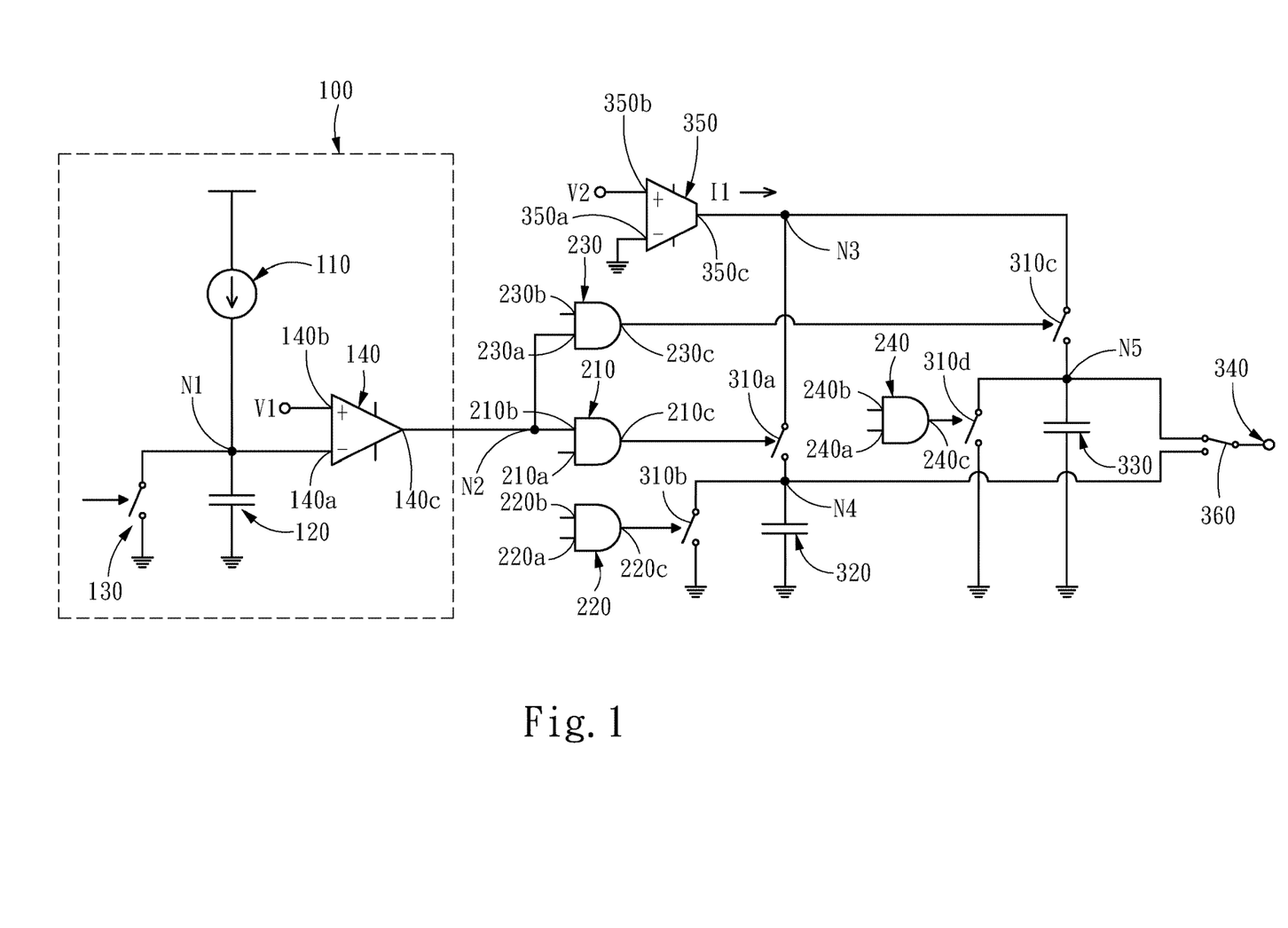
FIG. 1 shows a schematic diagram of a first example analog multiplication circuit in accordance with embodiments of the present invention.

FIG. 1 shows a schematic diagram of a first example analog multiplication circuit in accordance with embodiments of the present invention. The circuit includes a voltage to time converting means 100, a control logic means, and a multiplier means.

The voltage to time converting means 100 comprises a current source 110, a first capacitor 120, a reset switch 130 and a comparator 140. The current source 110 is configured to receive a supply voltage and generate a reference current. The first capacitor 120 is coupled with the current source 110. The reset switch 130 is coupled with a node N1 provided between the current source 110 and the first capacitor 120, which is driven by a reset signal. The comparator 140 has an inverting input 140a, a non-inverting input 140b and an output 140c. The inverting input 140a connects to the node N1 between the current source 110 and the first capacitor 120. The non-inverting input 140b is configured to receive a first voltage V1.

The control logic means comprises a first logic gate 210, a second logic gate 220, a third logic gate 230 and a fourth logic gate 240. The first logic gate 210 has a first gate input 210a, a second gate input 210b and a gate output 210c. The first gate input 210a is adapted to receive a first phase signal. The second gate input 210b is adapted to be coupled to the output 140c of the comparator 140. The gate output 210c outputs a first control signal. The second logic gate 220 has a first gate input 220a, a second gate input 220b and a gate output 220c. The first gate input 220a is adapted to receive the first phase signal. The second gate input 220b is adapted to receive the reset signal. The gate output 220c outputs a second control signal. The third logic gate 230 has a first gate input 230a, a second gate input 230b and a gate output 230c. The first gate input 230a is adapted to connect to a node N2 between the second gate input 210b of the first logic gate 210 and the output 140c of the comparator 140. The second gate input 230b is adapted to receive a second phase signal. The gate output 230c outputs a third control signal. The fourth logic gate 240 has a first gate input 240a, a second gate input 240b and a gate output 240c. The first gate input 240a is adapted to receive the second phase signal. The second gate input 240b is adapted to receive the reset signal. The gate output 240c outputs a fourth control signal.

The multiplier means is coupled with the voltage to time converting means 100 and comprises a switch unit, a second capacitor 320, a third capacitor 330 and an output terminal 340. The switch unit includes a first switch 310a, a second switch 310b, a third switch 310c and a fourth switch 310d. The first switch 310a, the second switch 310b, the third switch 310c and the fourth switch 310d are controlled by the first control signal, the second control signal, the third control signal, and the fourth control signal respectively. A node N3 is provided between the first switch 310a and the third switch 310c, which is configured to receive a first current I1 from an operational transconductance amplifier 350. The operational transconductance amplifier 350 has a non-inverting input 350b, an inverting input 350a and an output 350c. The non-inverting input 350b is coupled to a second voltage V2. The inverting input 350a is connected to ground. The output 350c is configurated to provide the first current I1. The second capacitor 320 is coupled to a node N4 between the first switch 310a and the second switch 310b. The third capacitor 330 is coupled to a node N5 between the third switch 310c and the fourth switch 310d. The output terminal 340 is selectively coupled to the node N4 between the first switch 310a and the second switch 310b and the node N5 between the third switch 310c and the fourth switch 310d by a fifth switch 360. The fifth switch 360 is controlled by the first phase signal. When the first phase signal is 1, then the fifth switch 360 is connected to the node N5 (upper position as shown in FIG. 1); while when the first phase signal is 0, then the fifth switch 360 is connected to the node N4 (lower position).

Figure 2:
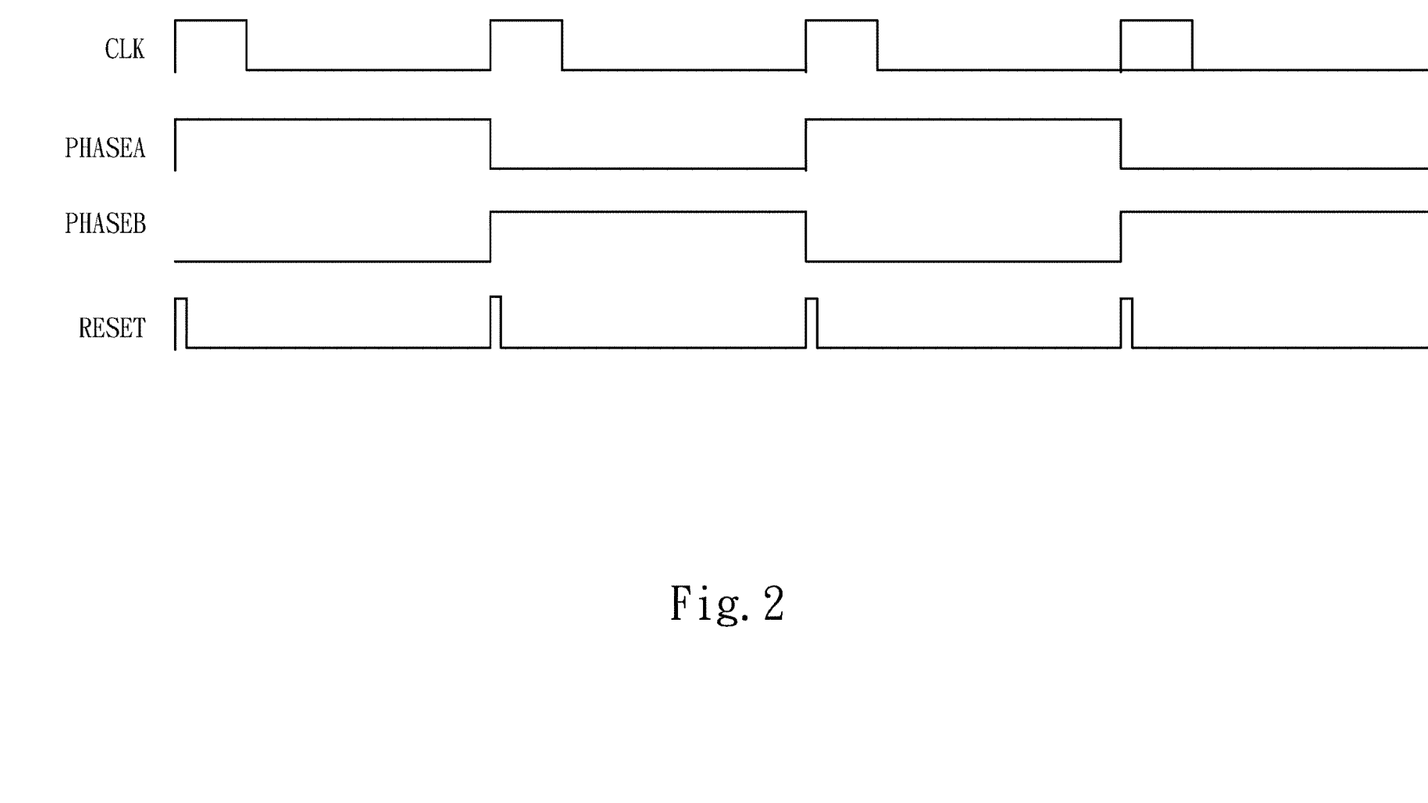
FIG. 2 shows a schematic diagram of waveform in the circuit of FIG. 1.

The waveforms of the clock signal, the first phase signal, the second phase signal and the reset signal are shown in FIG. 2.

In the first example analog multiplication circuit, the following formula can be used to express $T_{V1}$ which is the pulse width of the signal at the output 140c of the comparator 140 in terms of voltage of the first voltage ($V_1$), capacitance of the first capacitor ($C_1$) and current of the reference current ($I_{REF}$) from the current source 110, as follows:

$$T_{V1} = C_1 \frac{V_1}{I_{REF}} \quad (1)$$

$T_{V1}$ controls the charge on the second capacitor 320 in the first phase and on the third capacitor 330 in the second phase. The voltage on the capacitor at the end of the phase can be expressed as:

$$V_0 = V_2 G_{M1} \frac{T_{V1}}{C_2} \quad (2)$$

$C_2$ represents capacitance of the second capacitor 320 and/or the third capacitor 330, $V_2$ represents voltage of the second voltage $V_2$, and $G_{M1}$ represents transconductance coefficient of the operational transconductance amplifier 350.

Then, the output voltage ($V_0$) from the output terminal 340 could be obtained from the following relationship:

$$V_0 = \frac{C_1}{C_2} V_1 V_2 \frac{G_{M1}}{I_{REF}} \quad (3)$$

$V_1$ represents voltage of the first voltage V1, and $I_{REF}$ represents current of the reference current.

If the first through third capacitors are made from the same type of device under the same manufacture process. The variation due to the manufacture process or operation environment (such as temperature) would be minimized or cancelled out with the help of the form of the above relationship. That is, the circuit component factors appear in the numerator and denominator will be equal, such that the influence from either the process variation or temperature variation can be minimized or cancelled out.

The current appearing in the above relationship may be calculated by dividing a reference voltage (such as the bandgap) to a resistor. Also, the transconductance amplifier 350 also includes resistors to achieve the transconductance function. So similarly, if the resistors in the analog multiplication circuit are made from the same type of device under the same manufacture process, the variation due to the manufacture process or operation environment (such as temperature) would be reduced.

In one embodiment, the first through third capacitors are made from the same type of device or in the same manufacture process and the resistors in the analog multiplication circuit are made from the same type of device or in the same manufacture process. The formula (3) could be expressed as:

$$V_0 = \frac{V_2 V_1}{V_{REF}} CONST \quad (4)$$

It will be appreciated that a discrete analog multiplier without any process or temperature dependence is obtained.

Figure 3:
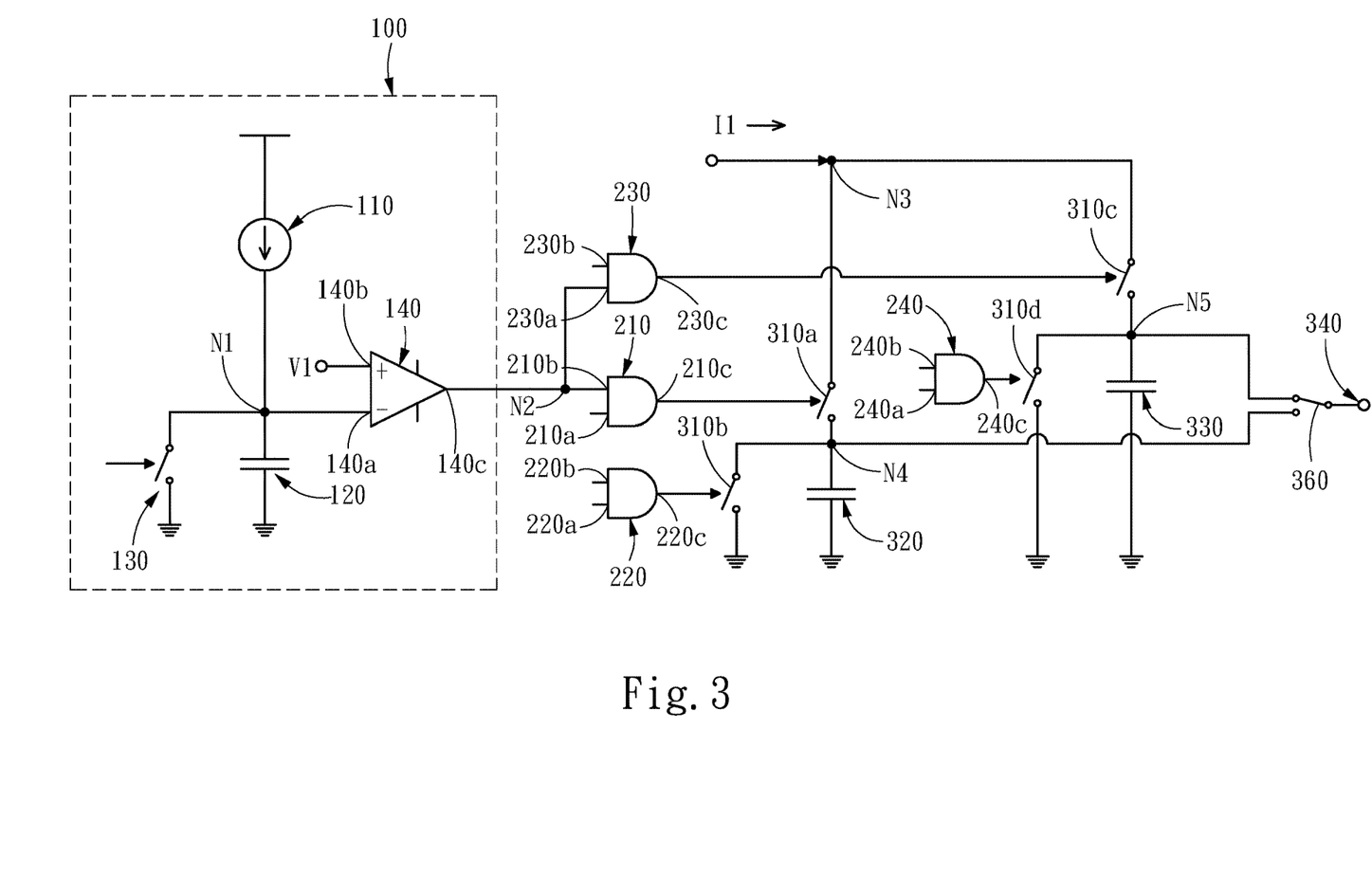
FIG. 3 shows a schematic diagram of a second example analog multiplication circuit in accordance with embodiments of the present invention.

FIG. 3 shows a schematic diagram of a second example analog multiplication circuit in accordance with embodiments of the present invention. The circuit in FIG. 3 replaces the transconductance amplifier 350 by a current source (the first current I1) to be multiplied. It can be scaled by a mirror if needed. In the second example analog multiplication circuit, the output voltage ($V_0$) from the output terminal 340 could be obtained from the following relationship:

$$V_0 = \frac{C_1}{C_2} V_1 I_1 \frac{1}{I_{REF}} \quad (5)$$

$C_1$ represents capacitance of the first capacitor, $C_2$ represents capacitance of the second capacitor and/or the third capacitor, $I_1$ represents current of the first current I1, $V_1$ represents voltage of the first voltage V1, and $I_{REF}$ represents current of the reference current.

In the formula (5), the output voltage ($V_0$) from the output terminal 340 is produced by multiplying the current of the first current I1 and the voltage of the first voltage V1. The associated variability can be easily and effectively compensated if the source of the first current I1 and the first voltage V1 are known.

Figure 4:
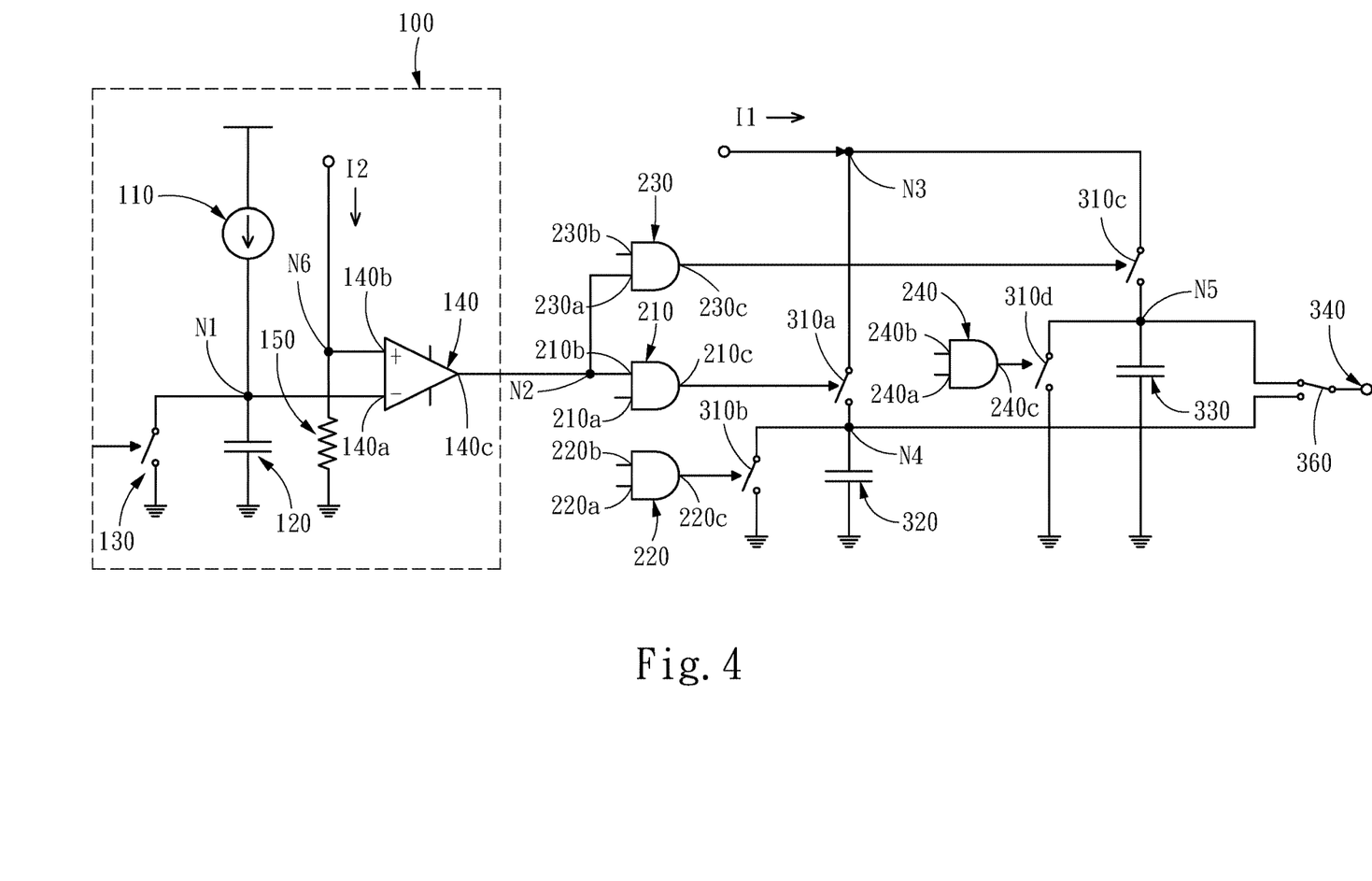
FIG. 4 shows a schematic diagram of a third example analog multiplication circuit in accordance with embodiments of the present invention.

FIG. 4 shows a schematic diagram of a third example analog multiplication circuit in accordance with embodiments of the present invention. Compared to the second example, the third analog multiplication circuit further includes a resistor 150 in the voltage to time converting means 100. The resistor 150 is connected to the non-inverting input 140b of the comparator 140. A node N6 is provided between the non-inverting input 140b and the resistor 150, which is configured to receive a second current I2. An alternate example of FIG. 4 is provided to multiply two currents, the output voltage ($V_0$) from the output terminal 340 could be obtained from the following relationship:

$$V_0 = \frac{C_1}{C_2} I_2 I_1 \frac{R_1}{I_{REF}} \quad (6)$$

$C_1$ represents capacitance of the first capacitor, $C_2$ represents capacitance of the second capacitor and/or the third capacitor, $I_2$ represents current of the second current I2, $I_1$ represents current of the first current I1, $R_1$ represents the resistance of the resistor 150, and $I_{REF}$ represents current of the reference current.

Similar to the relationships in the first and second examples, the variation of the capacitors due to the manufacture process or operation environment (such as temperature) could be reduced. The $$\frac{R_1}{I_{REF}}$$

in the formula (6) represents the variability due to square of the conversion impedance since the product of the currents is represented as a voltage in the end.

Figure 5:
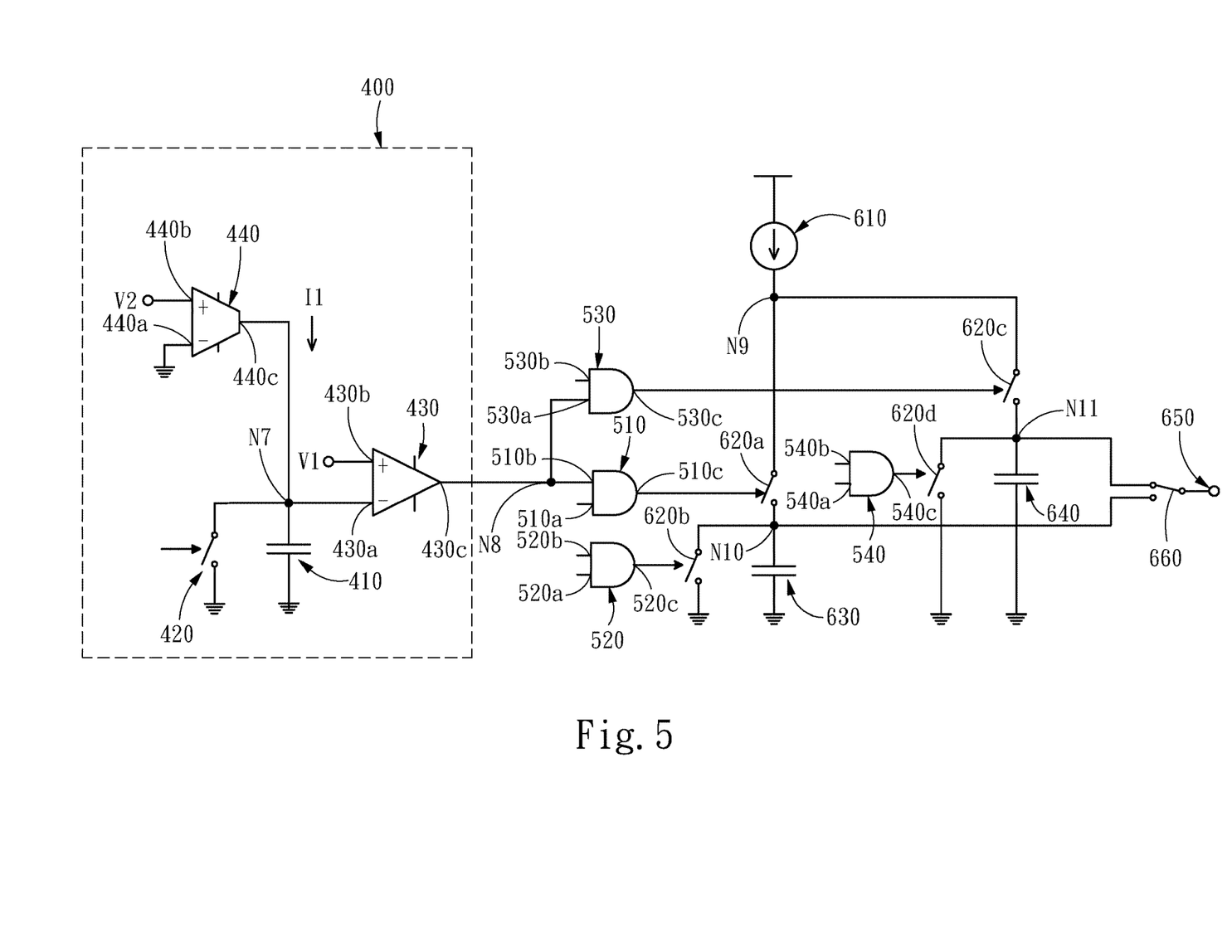
FIG. 5 shows a schematic diagram of a first example analog division circuit in accordance with embodiments of the present invention.

FIG. 5 shows a schematic diagram of a first example analog division circuit in accordance with embodiments of the present invention. The circuit includes a voltage to time converting means 400, a control logic means, and a multiplier means.

The voltage to time converting means 400 comprises a first capacitor 410, a reset switch 420, a comparator 430 and an operational transconductance amplifier 440. The reset switch 420 is coupled with the first capacitor 410, which is driven by a reset signal. The comparator 430 has an inverting input 430a, a non-inverting input 430b and an output 430c. The inverting input 430a connects to a node N7 between the reset switch 420 and the first capacitor 410. The non-inverting input 430b is configured for receiving a first voltage V1. The node N7 between the reset switch 420 and the first capacitor 410 is configured to receive a first current I1 output from the operational transconductance amplifier 440. The operational transconductance amplifier 440 has an inverting input 440a, a non-inverting input 440b and an output 440c. The non-inverting input 440b is coupled to a second voltage V2 and the inverting input 440a is connected to ground.

The control logic means comprises a first logic gate 510, a second logic gate 520, a third logic gate 530 and a fourth logic gate 540. The first logic gate 510 has a first gate input 510a, a second gate input 510b and a gate output 510c. The first gate input 510a is adapted to receive a first phase signal. The second gate input 510b is adapted to be coupled to the output 430c of the comparator 430. The gate output 510c outputs a first control signal. The second logic gate 520 has a first gate input 520a, a second gate input 520b and a gate output 520c. The first gate input 520a is adapted to receive the first phase signal. The second gate input 520b is adapted to receive the reset signal. The gate output 520c outputs a second control signal. The third logic gate 530 has a first gate input 530a, a second gate input 530b and a gate output 530c. The first gate input 530a is adapted to connect to a node N8 between the second gate input 510b of the first logic gate 510 and the output 430c of the comparator 430. The second gate input 530b is adapted to receive a second phase signal. The gate output 530c outputs a third control signal. The fourth logic gate 540 has a first gate input 540a, a second gate input 540b and a gate output 540c. The first gate input 540a is adapted to receive the second phase signal. The second gate input 540b is adapted to receive the reset signal. The gate output 540c outputs a fourth control signal.

The multiplier means is coupled with the voltage to time converting means 400 and comprises a current source 610, a switch unit, a second capacitor 630, a third capacitor 640 and an output terminal 650. The current source 610 is configured to receive a supply voltage and generate a reference current. The switch unit includes a first switch 620a, a second switch 620b, a third switch 620c and a fourth switch 620d. The first switch 620a, the second switch 620b, the third switch 620c and the fourth switch 620d are controlled by the first control signal, the second control signal, the third control signal, and the fourth control signal respectively. A node N9 is provided between the first switch 620a and the third switch 620c, which is configured to receive the reference current from the current source 610. The second capacitor 630 is coupled to a node N10 between the first switch 620a and the second switch 620b. The third capacitor 640 is coupled to a node N11 between the third switch 620c and the fourth switch 620d. The output terminal 650 is selectively coupled to the node N10 between the first switch 620a and the second switch 620b and the node N11 between the third switch 620c and the fourth switch 620d by a fifth switch 660. The fifth switch 660 is controlled by the first phase signal. When the first phase signal is 1, then the fifth switch 660 is connected to the node N11 (upper position as shown in FIG. 4); while when the first phase signal is 0, then the fifth switch 660 is connected to the node N10 (lower position).

In the first example analog division circuit, the following formula can be used to express $T_{V1}$ which is the pulse width of the signal at the output 430c of the comparator 430 in terms of voltage of the first voltage ($V_1$), voltage of the second voltage ($V_2$), capacitance of the first capacitor ($C_1$) and transconductance coefficient of the operational transconductance amplifier ($G_{M1}$), as follows:

$$T_{V1} = C_1 \frac{V_1}{V_2 G_{M1}} \qquad (7)$$

$T_{V1}$ controls the charge on the second capacitor 320 in the first phase and on the third capacitor 330 in the second phase. The voltage on the capacitor at the end of the phase can be expressed as:

$$V_0 = V_2 G_{M1} \frac{T_{V1}}{C_2} \qquad (8)$$

$C_2$ represents capacitance of the second capacitor 630 and/or the third capacitor 640.

Then, the output voltage ($V_0$) from the output terminal 650 could be obtained from the following relationship:

$$V_0 = \frac{C_1}{C_2} \frac{V_1}{V_2} \frac{I_{REF}}{G_{M1}} \qquad (9)$$

$I_{REF}$ represents current of the reference current from the current source 610.

Similar to the examples of analog multiplication circuit, if the capacitors are made from the same type of device under the same manufacture process, the variation due to the manufacture process or operation environment (such as temperature) would be minimized or cancelled out.

The current appearing in the above relationship may be calculated by dividing a reference voltage (such as the bandgap) to a resistor. Also, the operational transconductance amplifier 440 also includes resistors to achieve the transconductance function. Hence, if the resistors in the analog multiplication circuit are made from the same type of device under the same manufacture process, the variation due to the manufacture process or operation environment (such as temperature) would be reduced.

In one embodiment, the first and second capacitors are made from the same type of device or in the same manufacture process and the resistors in the analog division circuit are made from the same type of device or in the same manufacture process. The formula (9) could be expressed as:

$$V_0 = \frac{V_1}{V_2} V_{REF} CONST \qquad (10)$$

It will be appreciated that a discrete analog divider without any process or temperature dependence is obtained.

Figure 6:
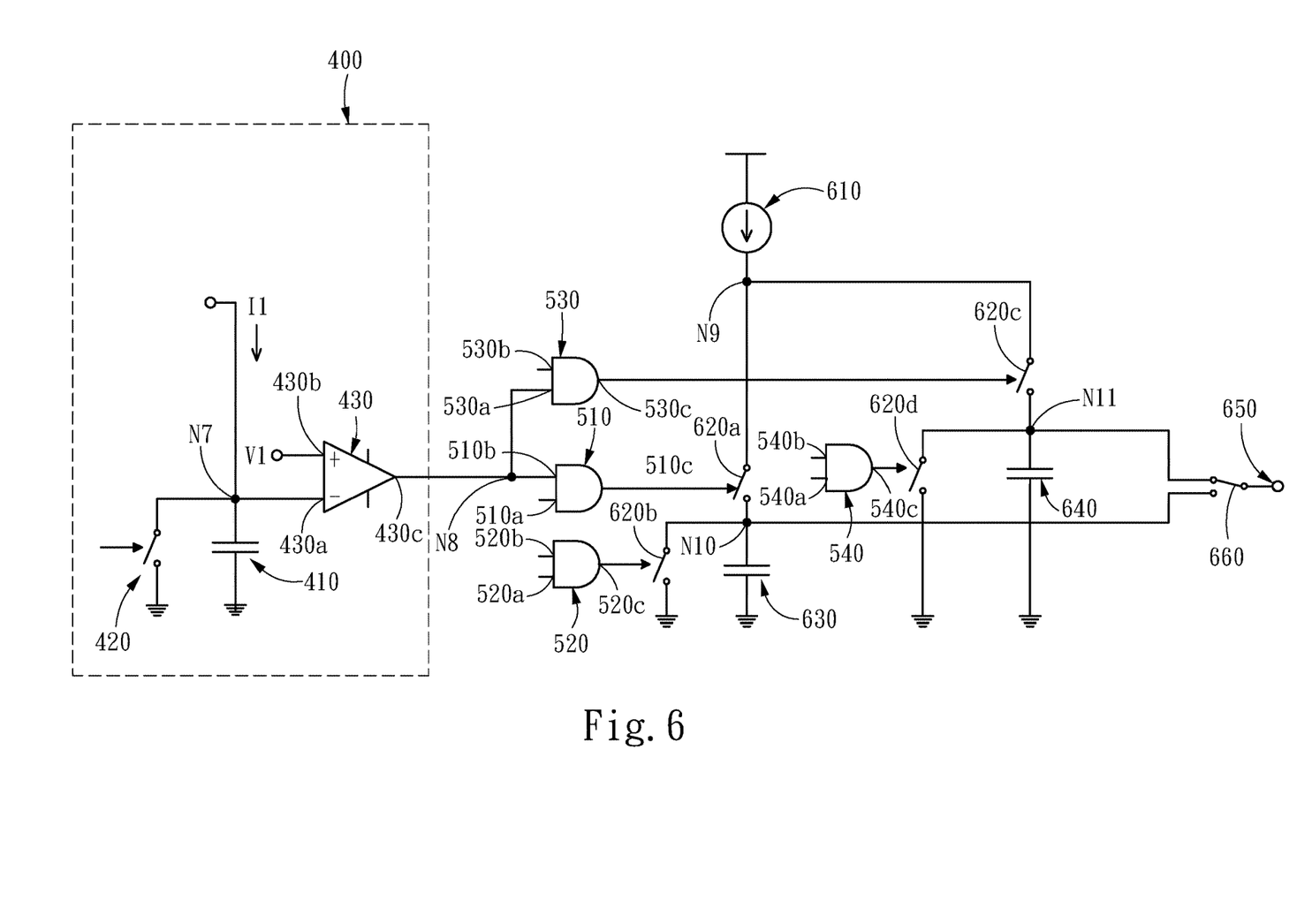
FIG. 6 shows a schematic diagram of a second example analog division circuit in accordance with embodiments of the present invention.

FIG. 6 shows a schematic diagram of a second example analog division circuit in accordance with embodiments of the present invention. The circuit in FIG. 6 replaces the operational transconductance amplifier 440 by a current (the first current) to be divided. It can be scaled by a mirror if needed. In the second example analog division circuit, the output voltage ($V_0$) from the output terminal 650 could be obtained from the following relationship:

$$V_0 = \frac{C_1}{C_2} \frac{V_1}{I_1} I_{REF} \quad (11)$$

$C_1$ represents capacitance of the first capacitor, $C_2$ represents capacitance of the second capacitor and/or the third capacitor, $V_1$ represents voltage of the first voltage V1, $I_1$ represents current of the first current, and $I_{REF}$ represents current of the reference current.

In the formula (11), the output voltage ($V_0$) from the output terminal 650 is produced by dividing the voltage of the first voltage V1 to the current of the first current I1. The associated variability can be easily and effectively compensated if the source of the first current I1 and the first voltage V1 are known.

Figure 7:
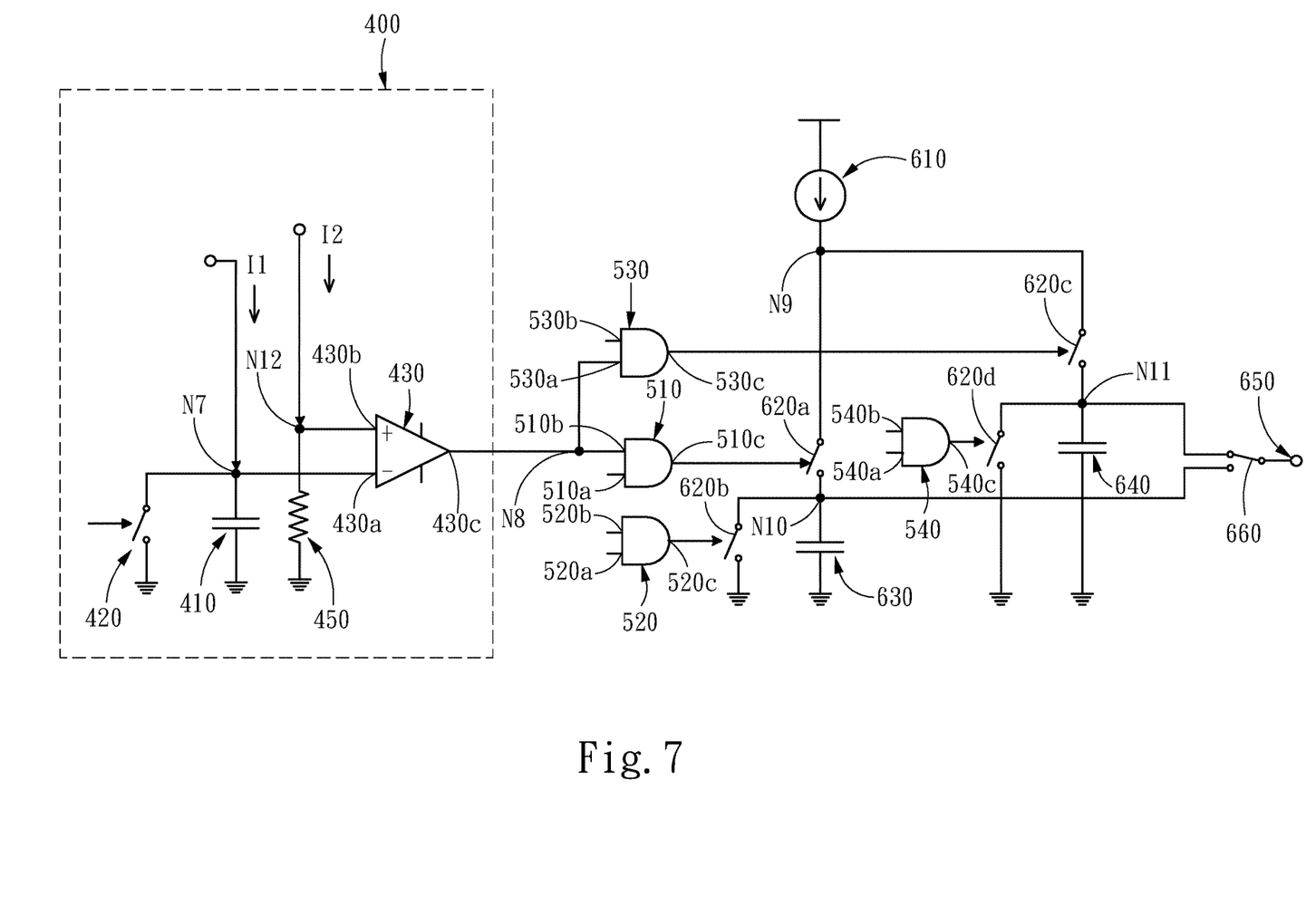
FIG. 7 shows a schematic diagram of a third example analog division circuit in accordance with embodiments of the present invention.

FIG. 7 shows a schematic diagram of a third example analog division circuit in accordance with embodiments of the present invention. Compared to the second example, the third analog multiplication circuit further includes a resistor 450 in the voltage to time converting means 400. The resistor 450 is connected to the non-inverting input 430b of the comparator 430. A node N12 is provided between the non-inverting input 430b and the resistor 450, which is configured to receive a second current I2. An alternate example of FIG. 7 is provided to multiply two currents, the output voltage ($V_0$) from the output terminal 650 could be obtained from the following relationship:

$$V_0 = \frac{C_1}{C_2} \frac{I_2}{I_1} I_{REF} R_1 \quad (12)$$

$C_1$ represents capacitance of the first capacitor, $C_2$ represents capacitance of the second capacitor and/or the third capacitor, $I_2$ represents current of the second current I2, $I_1$ represents current of the first current I1, $I_{REF}$ represents current of the reference current, and $R_1$ represents the resistance of the resistor 450.

Similar to the relationships in the first and second examples, the variation of the capacitors due to the manufacture process or operation environment (such as temperature) could be reduced. The $I_{REF}R_1$ in the formula (12) can also be replaced by a constant if the resistors in the analog multiplication circuit are made from the same type of device under the same manufacture process.

It is easy to see that the described embodiments can be used to generate a circuit to divide a current by a voltage as well.

What is claimed is:

1. A circuit comprising:
   an output terminal;
   a voltage to time circuit that receives a first input voltage and generates first and second pulses each having a width that is proportional to the first input voltage; and
   a multiplier circuit that receives a second input voltage, and comprises:
   a first phase that in response to receiving the first pulse charges a first capacitor for a time of the first pulse width with a current that is proportional to the second input voltage, the first phase producing an output voltage provided to the output terminal for a first time period wherein the output voltage is a product of the first and the second input voltages, and
   a second phase that in response to receiving the second pulse charges a second capacitor for a time of the second pulse width with the current that is proportional to the second input voltage, the second phase producing the output voltage provided to the output terminal for a second time period.

2. The circuit of claim 1 wherein the voltage to time circuit further includes a reset switch that controls the width of the pulse.

3. The circuit of claim 1 wherein the voltage to time circuit includes a comparator that receives the first input voltage.

4. The circuit of claim 1 wherein the multiplier circuit includes a transconductance amplifier that receives the second input voltage.

5. The circuit of claim 1 wherein the first phase of the multiplier circuit produces the output voltage while the second phase of the multiplier circuit is charging the second capacitor.

6. The circuit of claim 5 wherein the second phase of the multiplier circuit produces the output voltage while the first phase of the multiplier circuit is charging the first capacitor.

7. A circuit comprising:
   a circuit output terminal;
   a voltage to time circuit that receives a first input voltage and generates first and second pulses each having a width that is proportional to the first input voltage; and
   a multiplier circuit that receives a second input voltage and comprises:
   a first phase that charges a first capacitor for a duration of the first pulse width using a current that is proportional to the second input voltage, the first phase producing an output voltage at the circuit output terminal for a first time period that is a product of the first and the second input voltages, and
   a second phase that charges a second capacitor for a duration of the second pulse width using the current that is proportional to the second input voltage, the second phase producing an output voltage at the circuit output terminal that is a product of the first and second input voltages for a second time period.

8. The circuit of claim 7 wherein the voltage to time circuit further includes a reset switch that controls the width of the pulse.

9. The circuit of claim 7 wherein the first phase of the multiplier circuit produces the output voltage at the circuit output terminal while the second phase of the multiplier circuit charges the second capacitor.

10. The circuit of claim 9 wherein the second phase of the multiplier circuit produces the output voltage at the circuit output terminal while the first phase of the multiplier circuit is charging the first capacitor.

11. A method of operating a circuit, the method comprising:
   receiving, at a first input terminal, a first input voltage;
   receiving, at a second input terminal, a second input voltage;
   generating first and second pulses each having a width that is proportional to the first input voltage;

charging a first capacitor for a duration of the first pulse width using a current that is proportional to the second input voltage;

charging a second capacitor for a duration of the second pulse width using the current that is proportional to the second input voltage; and producing, at an output terminal, an output voltage that is a product of the first and the second input voltages, wherein the output voltage is produced using the first capacitor during a first time period and using a second capacitor during a second time period.

12. The method of claim 11 wherein the first pulse is generated via a current source charging a pulse control capacitor and wherein the first pulse width is controlled using a reset switch that couples the pulse control capacitor to a ground.

13. The method of claim 11 wherein the second capacitor is charged during the second time period.

14. The method of claim 13 wherein the second capacitor is charged during the first time period.

15. A circuit comprising:

a voltage to time divider circuit that receives a first input voltage and a second input voltage wherein the first input voltage generates a current proportional to the first input voltage and charges a capacitor until a voltage across the capacitor is equal to the second input voltage, the circuit producing first and second pulses each having a pulse width proportional to a ratio of the second input voltage to the first input voltage, the circuit generating an output voltage at an output terminal, wherein the output voltage is proportional to a ratio of the second input voltage to the first input voltage, the output voltage being produced via a first capacitor charged for a first duration of the first pulse width and via a second capacitor charged during a second duration of the second pulse width.

* * * * *